(12) United States Patent
Dibra et al.

(10) Patent No.: US 8,084,821 B2
(45) Date of Patent: Dec. 27, 2011

(54) INTEGRATED CIRCUIT INCLUDING A POWER MOS TRANSISTOR

(75) Inventors: Donald Dibra, Munich (DE); Christoph Kadow, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 781 days.

(21) Appl. No.: 12/022,679

(22) Filed: Jan. 30, 2008

(65) Prior Publication Data

US 2009/0189461 A1 Jul. 30, 2009

(51) Int. Cl.
*H01L 23/62* (2006.01)
(52) U.S. Cl. ........................... 257/355; 257/360
(58) Field of Classification Search .......... 257/355, 257/360
See application file for complete search history.

(56) References Cited

U.S. PATENT DOCUMENTS

| | | | |
|---|---|---|---|
| 4,890,142 A * | 12/1989 | Tonnel et al. ........... | 257/343 |
| 5,351,162 A | 9/1994 | Koishikawa | |
| 6,703,895 B1 | 3/2004 | Khemka et al. | |
| 7,157,338 B2 | 1/2007 | Zommer et al. | |
| 7,242,113 B2 | 7/2007 | Oumaru et al. | |
| 7,538,995 B2 | 5/2009 | Okushima | |
| 2004/0075113 A1 | 4/2004 | Nakayama | |
| 2007/0228476 A1 | 10/2007 | Okushima | |

FOREIGN PATENT DOCUMENTS

| | | |
|---|---|---|
| DE | 103 45 556 | 5/2005 |
| EP | 0 517 261 | 12/1992 |
| EP | 1 538 671 | 6/2005 |

OTHER PUBLICATIONS

"Detection and Optimization of Temperature Distribution Across Large-Area Power MOSFETs to Improve Energy Capability", Vishnu Khemka, IEEE, 2004 (8 pgs.).
"Fast Transient Infrared Thermal Analysis of Smart Power MOSFETS in permanent Short Circuit Operation", Giovanni Breglio, et al., IEEE, 2006 (4 pgs.).
"Impact of Thermal Overload Operation on Wirebond and Metallization Reliability in Smart Power Devices", Michael Glavanovics, et al., IEEE, 2004 (4 pgs.).

* cited by examiner

*Primary Examiner* — Douglas Menz
(74) *Attorney, Agent, or Firm* — Dicke, Billig & Czaja, PLLC

(57) ABSTRACT

An integrated circuit includes a first transistor having a first gate and a first source and a second transistor having a second gate and a second source. The integrated circuit includes a first source contact adjacent the second transistor and coupled to the first source and the second source. The integrated circuit includes a first bond wire coupled to the first source contact.

24 Claims, 6 Drawing Sheets

INTEGRATED CIRCUIT INCLUDING A POWER MOS TRANSISTOR

BACKGROUND

Metal-oxide-semiconductor (MOS) transistors, such as power MOS field-effect transistors (MOSFETs), are used in power applications to switch external loads. The MOS transistors may be incorporated with smart power technologies such that the MOS transistors are protected against short circuit and other overload conditions. The smart power technologies may include temperature and/or current sensors to sense short circuit and other overload conditions. Despite the short circuit and overload protection circuitry, the MOS transistors may fail under repetitive short circuit or other overload conditions. The failure of the MOS transistors is often associated with thermomechanical failure of the bond wires and/or the metallization contacting, adjacent, and nearby the bond wires.

For these and other reasons, there is a need for the present invention.

SUMMARY

One embodiment provides an integrated circuit. The integrated circuit includes a first transistor having a first gate and a first source and a second transistor having a second gate and a second source. The integrated circuit includes a first source contact adjacent the second transistor and coupled to the first source and the second source. The integrated circuit includes a first bond wire coupled to the first source contact.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
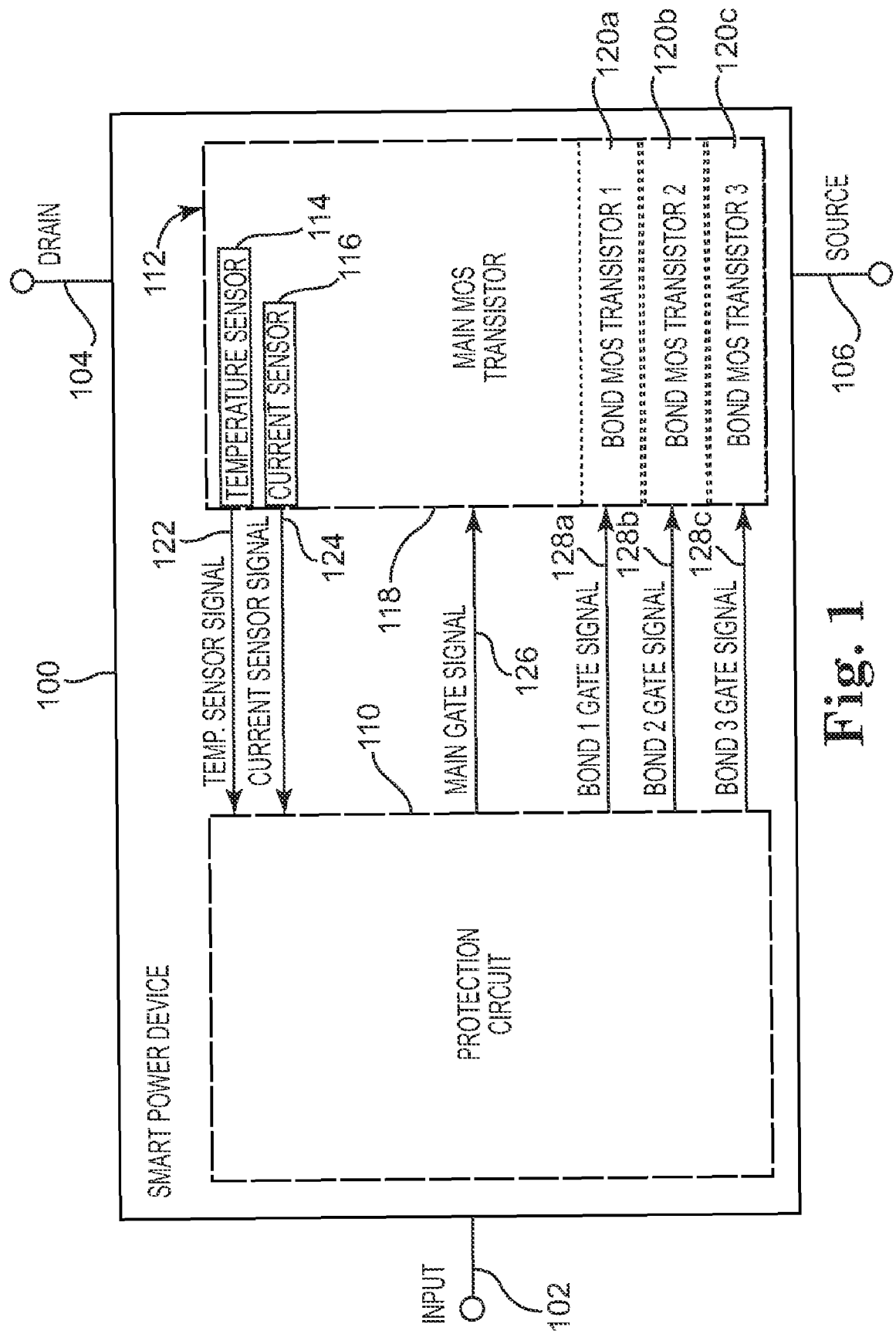
FIG. 1 is a block diagram illustrating one embodiment of a smart power device.

FIG. 1 is a block diagram illustrating one embodiment of a smart power device 100. In one embodiment, smart power device 100 is an integrated circuit or part of an integrated circuit. In one embodiment, smart power device 100 is used to switch an external load. Smart power device 100 has increased reliability under short circuit and other overload conditions compared to typical smart power devices. The increased reliability is achieved by smart power device 100 dynamically adapting the active area of a power metal-oxide-semiconductor (MOS) transistor in response to the load conditions.

The active area of the power MOS transistor is dynamically adapted to the load conditions by dividing the power MOS transistor into several regions having common source and drain terminals or contacts, but separate gate terminals or contacts. The power MOS transistor is divided into a main transistor region and one or more bond transistors regions. A bond wire is electrically coupled to each source contact, which is adjacent to each bond transistor region and away from the main transistor region.

The gate voltages of the different transistor regions are adjusted based on the operating conditions. Under normal operating conditions, all the transistor regions have the same gate voltage; therefore, all the transistor regions contribute to the active area and the on-resistance of the power MOS transistor is minimized. Under special operating conditions (e.g., short circuit or other overload conditions), the bond transistor regions of the power MOS transistor are turned off to reduce the thermomechanical stress in those transistor regions where the bond wires are electrically coupled to the source contacts.

Smart power device 100 receives an input signal on input signal path 102 and switches an external load through drain signal path 104 and source signal path 106 based on the input signal. Smart power device 100 includes a protection circuit 110 and a smart power MOS transistor 112. Power MOS transistor 112 includes a temperature sensor 114, a current sensor 116, a main MOS transistor 118, and one or more bond MOS transistors 120a-120c. In other embodiments, power MOS transistor 112 includes any suitable number of bond MOS transistors 120 based on the operating specifications (e.g., current) for smart power device 100.

As used herein, the term "electrically coupled" is not meant to mean that the elements must be directly coupled together and intervening elements may be provided between the "electrically coupled" elements.

Temperature sensor 114 of power MOS transistor 112 is electrically coupled to protection circuit 110 through temperature sensor signal path 122. Current sensor 116 of power MOS transistor 112 is electrically coupled to protection circuit 110 through current sensor signal path 124. Protection circuit 110 is electrically coupled to the gate of main MOS transistor 118 of power MOS transistor 112 through main gate signal path 126. Protection circuit 110 is electrically coupled to a first bond MOS transistor 120a of power MOS transistor 112 through a first bond gate signal path 128a.

Protection circuit 110 is electrically coupled to a second bond MOS transistor 120b of power MOS transistor 112 through a second bond gate signal path 128b. Protection circuit 110 is electrically coupled to a third bond MOS transistor 120c of power MOS transistor 112 through a third bond gate signal path 128c.

Temperature sensor 114 of power MOS transistor 112 senses the temperature of power MOS transistor 112. Temperature sensor 114 outputs a temperature sensor signal on temperature sensor signal path 122 indicating the sensed temperature. Current sensor 116 of power MOS transistor 112 senses the current through power MOS transistor 112. Current sensor 116 outputs a current sensor signal on current sensor signal path 124 indicating the sensed current.

Main MOS transistor 118 of power MOS transistor 112 receives a main gate signal on main gate signal path 126. Main MOS transistor 118 shares a common source connection and a common drain connection with bond MOS transistors 120a-120c such that the source-drain paths of main MOS transistor 118 and bond MOS transistors 120a-120c are electrically in parallel. The common source connection is electrically coupled to source signal path 106. The common drain connection is electrically coupled to drain signal path 104. In response to a suitable main gate signal voltage, main MOS transistor 118 turns on to switch on an external load electrically coupled between drain signal path 104 and source signal path 106.

First bond MOS transistor 120a receives a first bond gate signal on first bond gate signal path 128a. Second bond MOS transistor 120b receives a second bond gate signal on second bond gate signal path 128b. Third bond MOS transistor 120c receives a third bond gate signal on third bond gate signal path 128c. In response to suitable bond gate signal voltages and with main MOS transistor 118 turned on, bond MOS transistors 120a-120c turn on to switch on an external load electrically coupled between drain signal path 104 and source signal path 106.

Protection circuit 110 includes suitable logic circuitry for controlling the operation of smart power device 100. Protection circuit 110 receives an input signal on input signal path 102 from an external device and turns power MOS transistor 112 on or off in response to the input signal. Protection circuit 112 turns power MOS transistor 112 on or off by controlling the main gate signal voltage on main gate signal path 126 and the bond gate signal voltages on bond gate signal paths 128a-128c.

Protection circuit 110 receives the temperature sensor signal on temperature sensor signal path 122. Based on the temperature sensor signal, protection circuit 110 determines whether power MOS transistor 112 is in an over-temperature condition. Protection circuit 110 receives the current sensor signal on current sensor signal path 124. Based on the current sensor signal, protection circuit 110 determines whether power MOS transistor 112 is in a short circuit or other overload condition.

In response to an over-temperature, short circuit, or other overload condition, protection circuit 110 turns off bond MOS transistors 120a-120c and places main MOS transistor 118 into a protection mode. Once the over-temperature, short circuit, or other overload condition is corrected, protection circuit 110 turns bond MOS transistors 120a-120c back on. If the over-temperature, short circuit, or other overload condition persists for a predetermined time, protection circuit 110 also turns off main MOS transistor 118.

During operation, protection circuit 110 turns on power MOS transistor 112 by applying a main gate signal voltage to main MOS transistor 118 to turn on main MOS transistor 118 and bond gate signal voltages to bond MOS transistors 120a-120c to turn on bond MOS transistors 120a-120c. With power MOS transistor 112 turned on, protection circuit 110 monitors the temperature of power MOS transistor 112 and the current through power MOS transistor 112 via the temperature sensor signal and the current sensor signal.

In response to normal temperature and current conditions as indicated by the temperature sensor signal and the current sensor signal, protection circuit 110 maintains power MOS transistor 112 in the on state. In response to a short circuit or other overload condition as indicated by the current sensor signal and/or the temperature sensor signal, protection circuit 110 immediately turns off bond MOS transistors 120a-120c. In general, the current sensor can detect a short circuit or other overload condition quicker than the temperature sensor can detect a short circuit or other overload condition.

By immediately turning off bond MOS transistors 120a-120c in response to a short circuit or other overload condition, no current flows beneath the bond wires coupled to the source contacts adjacent bond MOS transistors 120a-120c. With bond MOS transistors 120a-120c turned off, there is no power dissipation in bond MOS transistors 120a-120c and therefore reduced thermomechanical stress on the bond wires and on the metallization contacting, adjacent, and nearby the bond wires.

By dynamically adapting the active area of power MOS transistor 112, the complete area contributes to the on-resistance under normal operating conditions. Under short circuit or other overload conditions, however, only a fraction of the area contributes to the on-resistance. Therefore under short circuit or other overload conditions, the current in power MOS transistor 112 is reduced and the turned off areas experience reduced or no thermomechanical stress. The reduced thermomechanical stress on the bond wires and the adjacent and nearby metallization provides improved device reliability under repetitive stress conditions.

To reduce the thermomechanical stress at the wire bonds, the temperature rise per short circuit or other overload condition cycle should be minimized. Therefore, bond MOS transistors 120a-120c should be turned off as quickly as possible. This minimizes the amount of energy dissipated beneath the bond wires and therefore also minimizes the temperature rise. Because the current sensor typically has the fastest response in a smart power device, in one embodiment the current sensor is used for detecting short circuit or other overload conditions.

Figure 2:
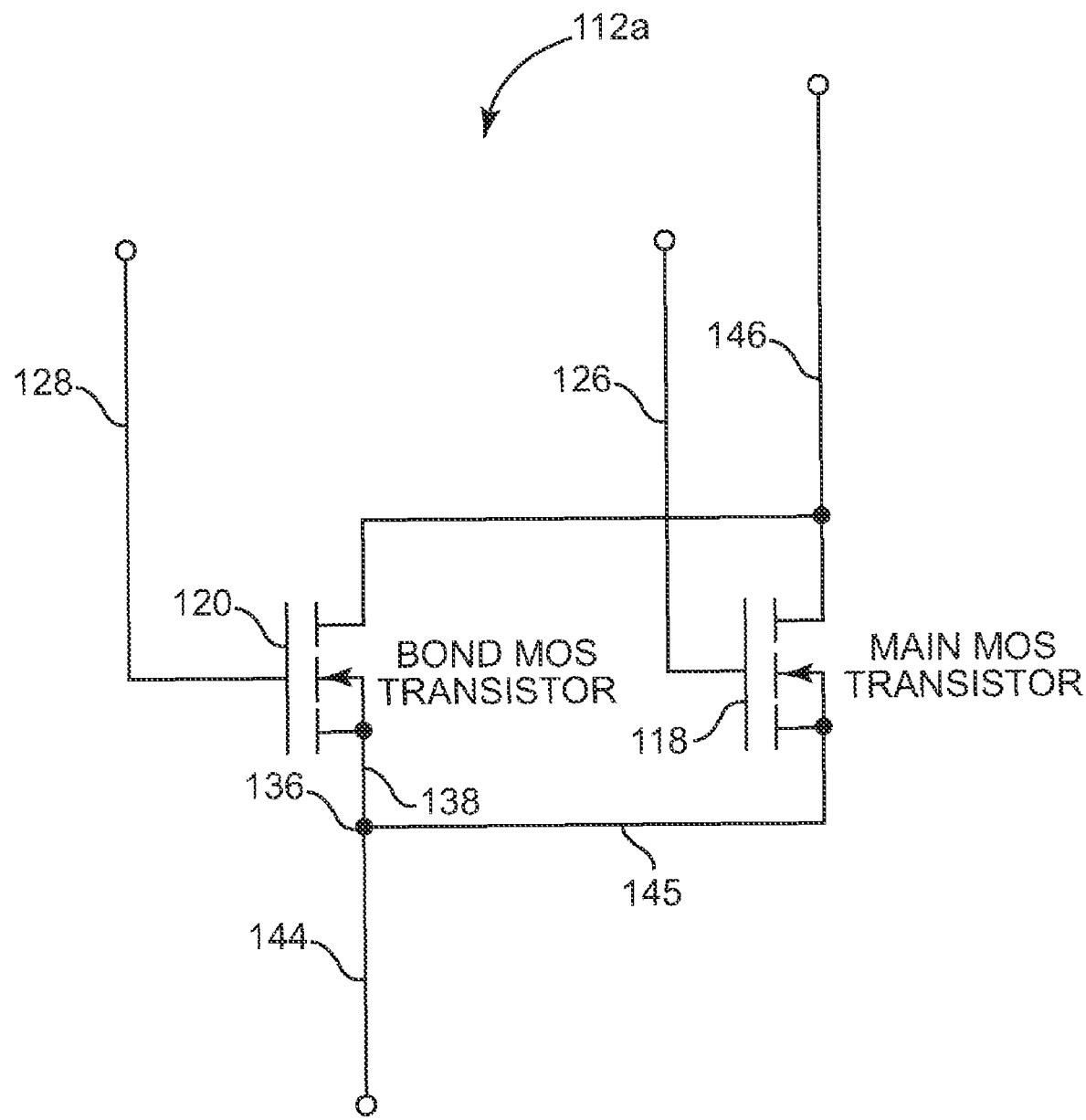
FIG. 2 is a schematic diagram illustrating one embodiment of a power MOS transistor.

FIG. 2 is a schematic diagram illustrating one embodiment of a power MOS transistor 112a. In this embodiment, power MOS transistor 112a includes a main MOS transistor 118 and a single bond MOS transistor 120. In one embodiment, power MOS transistor 112a provides power MOS transistor 112 previously described and illustrated with reference to FIG. 1.

The gate of bond MOS transistor 120 is electrically coupled to a bond gate signal path 128. The gate of main MOS transistor 118 is electrically coupled to a main gate signal path 126. The drain of bond MOS transistor 120 and the drain of main MOS transistor 118 are electrically coupled to a common drain signal path 146. The source of bond MOS transistor 120 is electrically coupled to a source bond wire 144 at a contact 136 through signal path 138. The source of main MOS transistor 118 is electrically coupled to source bond wire 144 at contact 136 through signal path 145. Contact 136 is adjacent bond MOS transistor 120 and away from main MOS transistor 118. In one embodiment, signal paths 138 and 145 are formed in a metallization layer of power MOS transistor 112a.

In one embodiment, protection circuit 110 controls bond MOS transistor 120 using a gate signal on bond gate signal path 128. In one embodiment, protection circuit 110 controls main MOS transistor 118 using a gate signal on main gate signal path 126. During normal operation, protection circuit 110 applies a first voltage on bond gate signal path 128 and main gate signal path 126 to turn on bond MOS transistor 120 and main MOS transistor 118. During a short circuit or other overload condition, protection circuit 110 applies a second voltage on bond gate signal path 128 to turn off bond MOS transistor 120.

Figure 3:
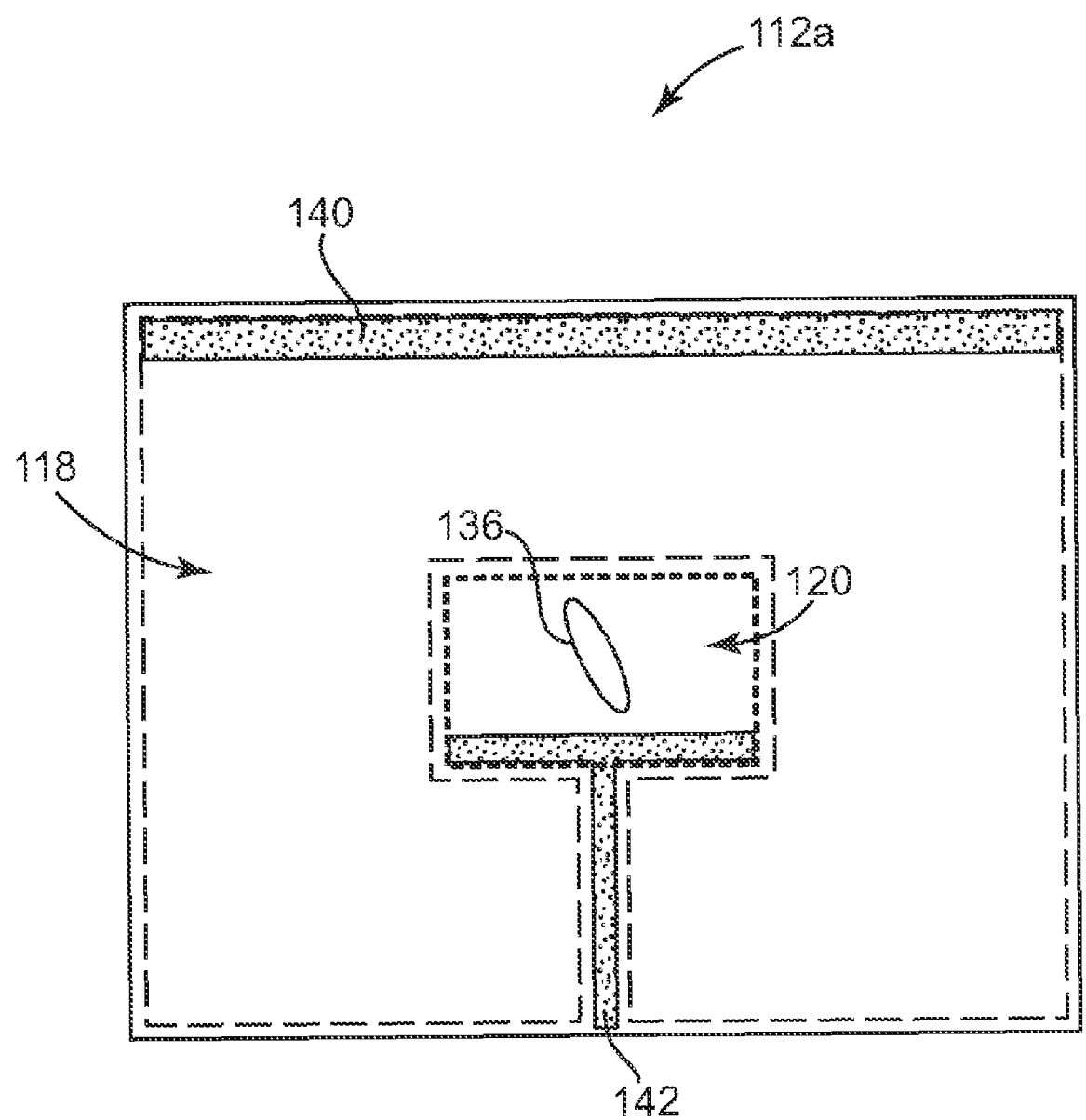
FIG. 3 is a top view illustrating one embodiment of a power MOS transistor.

FIG. 3 is a top view illustrating one embodiment of power MOS transistor 112a previously described and illustrated with reference to FIG. 2. Main MOS transistor 118 includes a gate 140. Bond MOS transistor 120 includes a gate 142 separate from gate 140. Main MOS transistor 118 and bond MOS transistor 120 share common source and drain contacts. In one embodiment, the active area of main MOS transistor 118 is larger than the active area of bond MOS transistor 120. The active area of main MOS transistor 118 laterally surrounds the active area of bond MOS transistor 120. In one embodiment, the active area of main MOS transistor 118 contacts the active area of bond MOS transistor 120.

Source bond wire 144 is electrically coupled to signal paths 138 and 145 at contact 136. In one embodiment, contact 136 is directly above bond MOS transistor 120. Therefore, by turning off bond MOS transistor 120 in response to a short circuit or other overload condition, the thermomechanical stress on source bond wire 144 and the adjacent and nearby metallization at contact 136 is reduced. With the thermomechanical stress reduced, the reliability of power MOS transistor 112a is improved for repetitive short circuit or other overload conditions.

Figure 4:
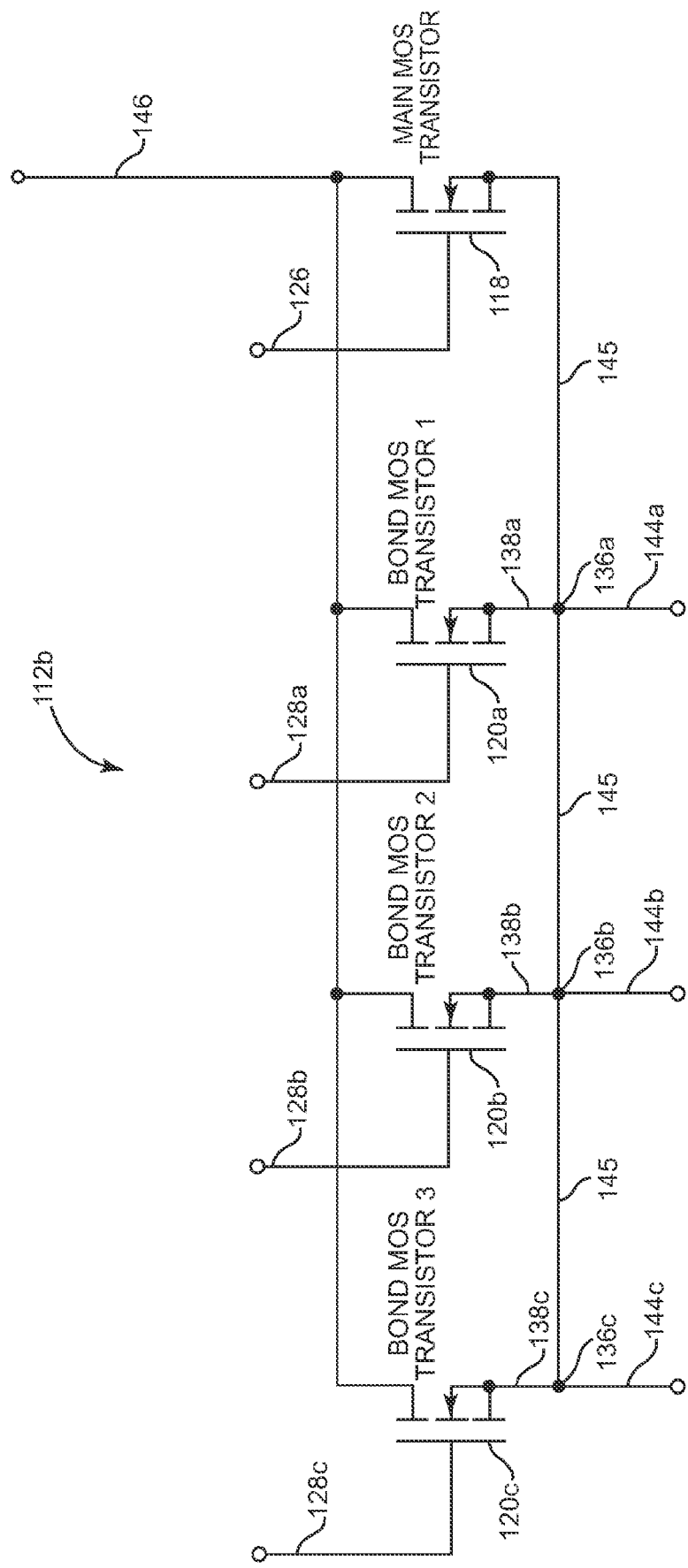
FIG. 4 is a schematic diagram illustrating another embodiment of a power MOS transistor.

FIG. 4 is a schematic diagram illustrating another embodiment of a power MOS transistor 112b. In this embodiment, power MOS transistor 112b includes a main MOS transistor 118 and three bond MOS transistors 120a-120c. In other embodiments, any suitable number of bond MOS transistors 120 are used. In one embodiment, power MOS transistor 112b provides power MOS transistor 112 previously described and illustrated with reference to FIG. 1.

The gate of first bond MOS transistor 120a is electrically coupled to a first bond gate signal path 128a. The gate of second bond MOS transistor 120b is electrically coupled to a second bond gate signal path 128b. The gate of third bond MOS transistor 120c is electrically coupled to a third bond gate signal path 128c. The gate of main MOS transistor 118 is electrically coupled to a main gate signal path 126. The drain of each bond MOS transistor 120a-120c and the drain of main MOS transistor 118 are electrically coupled to a common drain signal path 146.

The source of first bond MOS transistor 120a is electrically coupled to a corresponding first source bond wire 144a at a first contact 136a through signal path 138a. First contact 136a is adjacent first bond MOS transistor 120a and away from main MOS transistor 118. The source of second bond MOS transistor 120b is electrically coupled to a corresponding second source bond wire 144b at a second contact 136b through signal path 138b. Second contact 136b is adjacent second bond MOS transistor 120b and away from main MOS transistor 118. The source of third bond MOS transistor 120c is electrically coupled to a corresponding third source bond wire 144c at a third contact 136c through signal path 138c. Third contact 136c is adjacent third bond MOS transistor 120c and away from main MOS transistor 118. The source of main MOS transistor 118 is electrically coupled to source bond wires 144a-144c at contacts 136a-136c through signal path 145. In one embodiment, signal paths 138a-138c and 145 are formed in a metallization layer of power MOS transistor 112b.

In one embodiment, protection circuit 110 controls first bond MOS transistor 120a using a gate signal on first bond gate signal path 128a. Protection circuit 110 controls second bond MOS transistor 120b using a gate signal on second bond gate signal path 128b. Protection circuit 110 controls third bond MOS transistor 120c using a gate signal on third bond gate signal path 128c. In one embodiment, protection circuit 110 controls main MOS transistor 118 using a gate signal on main gate signal path 126. During normal operation, protection circuit 110 applies a first voltage on bond gate signal paths 128a-128c and main gate signal path 126 to turn on bond MOS transistors 120a-120c and main MOS transistor 118. During a short circuit or other overload condition, protection circuit 110 applies a second voltage on bond gate signal paths 128a-128c to turn off bond MOS transistors 120a-120c.

Figure 5:
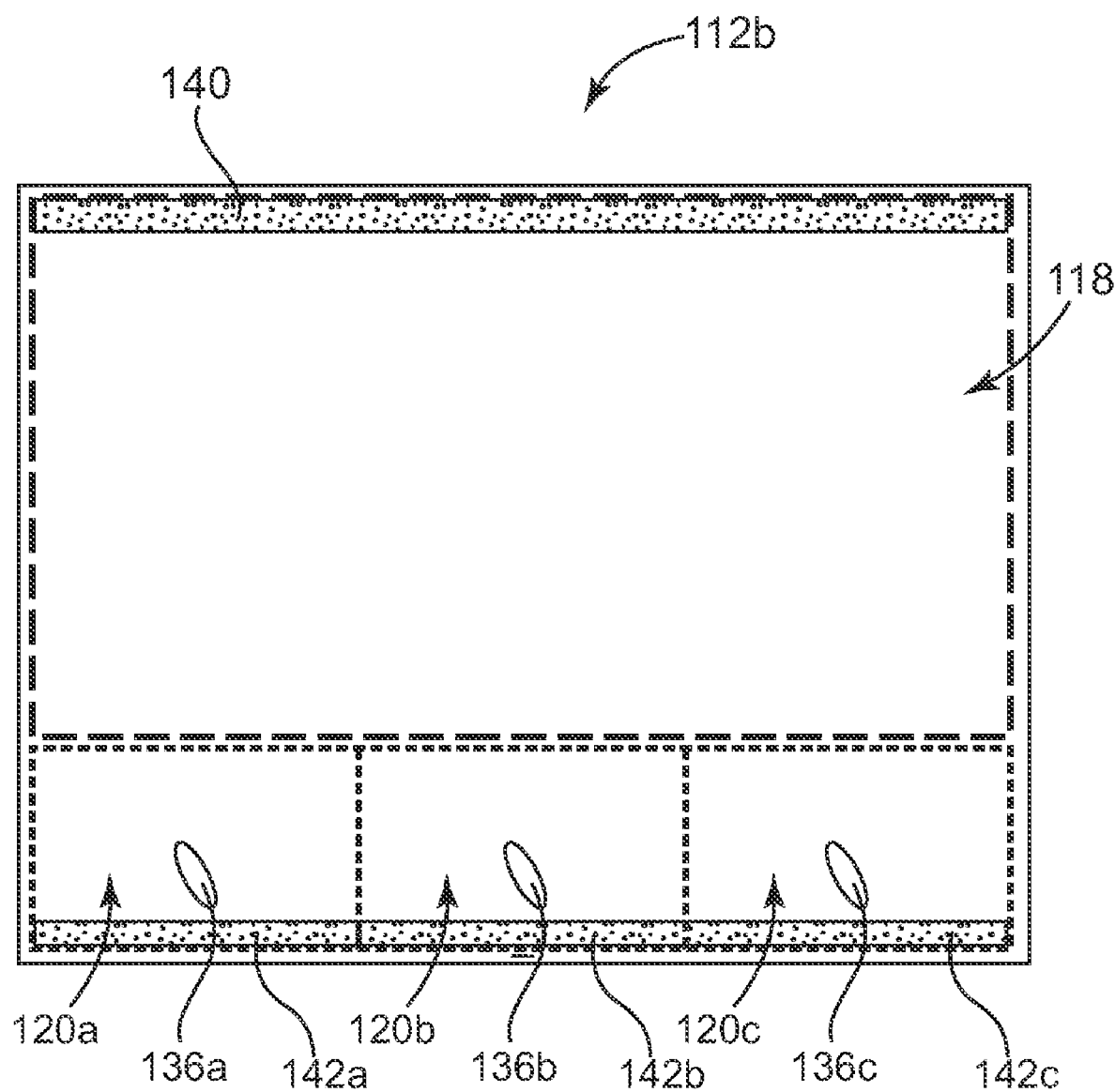
FIG. 5 is a top view illustrating another embodiment of a power MOS transistor.

FIG. 5 is a top view illustrating one embodiment of power MOS transistor 112b previously described and illustrated with reference to FIG. 4. Main MOS transistor 118 includes a main gate 140. First bond MOS transistor 120a includes a first gate 142a separate from main gate 140. Second bond MOS transistor 120b includes a second gate 142b separate from main gate 140 and first gate 142a. Third bond MOS transistor 120c includes a third gate 142c separate from main gate 140, first gate 142a, and second gate 142b. Main MOS transistor 118 and bond MOS transistors 120a-120c share common source and drain contacts. In one embodiment, the active area of main MOS transistor 118 is larger than the active areas of bond MOS transistors 120a-120c. The active area of main MOS transistor 118 is adjacent the active areas of bond MOS transistors 120a-120c. In one embodiment, the active area of main MOS transistor 118 contacts the active areas of bond MOS transistors 120a-120c.

First source bond wire 144a is electrically coupled to signal paths 138a and 145 at first contact 136a. In one embodiment, first contact 136a is directly above first bond MOS transistor 120a. Second source bond wire 144b is electrically coupled to signal paths 138b and 145 at second contact 136b. In one embodiment, second contact 136b is directly above second bond MOS transistor 120b. Third source bond wire 144c is electrically coupled to signal paths 138c and 145 at third contact 136c. In one embodiment, third contact 136c is directly above third bond MOS transistor 120c. Therefore, by turning off bond MOS transistors 120a-120c in response to a short circuit or other overload condition, the thermomechanical stress on source bond wires 144a-144c and the adjacent and nearby metallization at contacts 136a-136c is reduced. With the thermomechanical stress reduced, the reliability of power MOS transistor 112b is improved for repetitive short circuit or other overload conditions.

Figure 6:
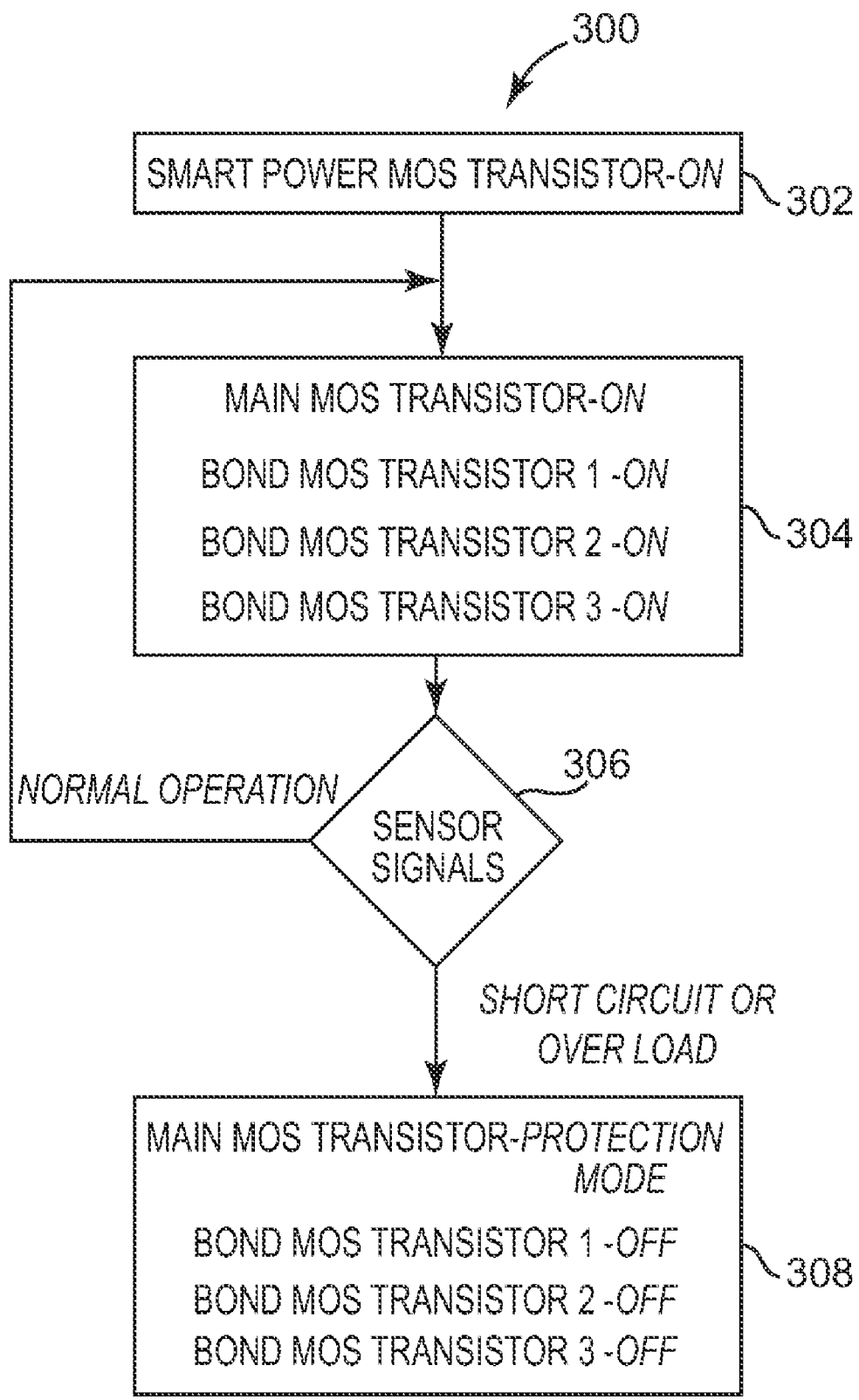
FIG. 6 is a flow diagram illustrating one embodiment of a method for operating a power MOS transistor.

FIG. 6 is a flow diagram illustrating one embodiment of a method 300 for operating power MOS transistor 112 of smart power device 100. At 302, an input signal is received on input signal path 102 of smart power device 100 to turn on smart power MOS transistor 112. At 304, protection circuit 110 applies a suitable voltage on main gate signal path 126 and bond gate signal paths 128a-128c to turn on main MOS transistor 118 and bond MOS transistors 120a-120c.

At 306, protection circuit 110 determines whether the current and/or temperature sensor signals are within normal operating ranges. If the current and/or temperature sensor signals are within normal operating ranges, control returns to 304 where protection circuit 110 maintains main MOS transistor 118 and bond MOS transistors 120a-120c in the on state. If the current and/or temperature sensor signals indicate a short circuit or other overload condition, then at 308 main MOS transistor 118 enters a protection mode and bond MOS transistors 120a-120c are turned off. With bond MOS transistors 120a-120c turned off, the thermomechanical stress at the bond wires and adjacent and nearby metallization at source contacts adjacent to bond MOS transistors 120a-120c is reduced. Once protection circuit 110 determines that the short circuit or other overload condition has been corrected, protection circuit 110 turns bond MOS transistors 120a-120c back on. If the short circuit or other overload condition persists for a predetermined time, protection circuit 110 also turns off main MOS transistor 118.

Embodiments provide a power MOS transistor with improved reliability compared to typical power MOS transistors under repetitive short circuit or other overload conditions. The improved reliability is provided by dynamically adapting the active area of the power MOS transistor to the load condition. By dynamically adapting the active area of the power MOS transistor to the load condition, thermomechanical stresses at bond wires and adjacent and nearby metallization at source contacts is reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
   a power metal-oxide-semiconductor (MOS) transistor for switching a load; and
   a protection circuit for sensing an overload condition of the power MOS transistor;
   wherein the power MOS transistor comprises:
      a first MOS transistor having a first gate, a first source, and a first drain;
      a second MOS transistor having a second gate, a second source, and a second drain, the second drain coupled to the first drain, the second MOS transistor having an active area smaller than an active area of the first MOS transistor; and
      a first source contact adjacent the second MOS transistor, the first source contact coupled to the first source and the second source;
   wherein the protection circuit applies a first voltage to the first gate and the second gate to turn on the first MOS transistor and the second MOS transistor in response to an input signal and applies a second voltage to the second gate to turn off the second MOS transistor in response to an overload condition.

2. The system of claim 1, further comprising:
   a first bond wire coupled to the first source contact.

3. The system of claim 1, wherein the power MOS transistor further comprises:
   a third MOS transistor having a third gate, a third source, and a third drain, the third drain coupled to the first drain and the second drain; and
   a second source contact adjacent the third MOS transistor, the second source contact coupled to the first source, the second source, and the third source;
   wherein the protection circuit applies the first voltage to the third gate to turn on the third MOS transistor in response to the input signal and applies the second voltage to the third gate to turn off the third MOS transistor in response to the overload condition.

4. The system of claim 3, further comprising:
   a first bond wire coupled to the first source contact; and
   a second bond wire coupled to the second source contact.

5. The system of claim 3, wherein the power MOS transistor further comprises:
   a fourth MOS transistor having a fourth gate, a fourth source, and a fourth drain, the fourth drain coupled to the first drain, the second drain, and the third drain; and
   a third source contact adjacent the fourth MOS transistor, the third source contact coupled to the first source, the second source, the third source, and the fourth source;
   wherein the protection circuit applies the first voltage to the fourth gate to turn on the fourth MOS transistor in response to the input signal and applies the second voltage to the fourth gate to turn off the fourth MOS transistor in response to sensing the overload condition.

6. The system of claim 5, further comprising:
   a first bond wire coupled to the first source contact;
   a second bond wire coupled to the second source contact; and
   a third bond wire coupled to the third source contact.

7. The system of claim 1, wherein the active area of the first MOS transistor laterally surrounds the active area of the second MOS transistor.

8. The system of claim 1, wherein the first source contact is directly above the second MOS transistor.

9. The system of claim 3, wherein the third MOS transistor has an active area smaller than the active area of the first MOS transistor.

10. The system of claim 3, wherein the second source contact is directly above the third MOS transistor.

11. The system of claim 5, wherein the fourth MOS transistor has an active area smaller than the active area of the first MOS transistor.

12. The system of claim 5, wherein the third source contact is directly above the fourth MOS transistor.

13. A system comprising:
    a power transistor for switching a load;
    a protection circuit for sensing an overload condition of the power transistor; and
    a first bond wire;
    wherein the power transistor comprises:
       a first transistor having a first gate, a first source, and a first drain;
       a second transistor having a second gate, a second source, and a second drain, the second drain coupled to the first drain, the second transistor having an active area smaller than an active area of the first transistor; and
       a first source contact directly above the second transistor and directly coupled to the first bond wire, the first source contact coupled to the first source and the second source via a metallization layer;
    wherein the protection circuit applies a first voltage to the first gate and the second gate to turn on the first transistor and the second transistor in response to an input signal and applies a second voltage to the second gate to turn off the second transistor in response to an overload condition.

14. The system of claim 13, wherein the active area of the first transistor laterally surrounds the active area of the second transistor.

15. The system of claim 13, wherein the protection circuit applies the second voltage to the second gate to turn off the second transistor in response to an over-temperature condition.

16. The system of claim 13, further comprising:
a second bond wire;
wherein the power transistor further comprises:
  a third transistor having a third gate, a third source, and a third drain, the third drain coupled to the first drain and the second drain, the third transistor having an active area smaller than the active area of the first transistor; and
  a second source contact directly above the third transistor and directly coupled to the second bond wire, the second source contact coupled to the first source, the second source, and the third source via the metallization layer; and
wherein the protection circuit applies the first voltage to the third gate to turn on the third transistor in response to the input signal and applies the second voltage to the third gate to turn off the third transistor in response to the overload condition.

17. The system of claim 16, further comprising:
a third bond wire;
wherein the power transistor further comprises:
  a fourth transistor having a fourth gate, a fourth source, and a fourth drain, the fourth drain coupled to the first drain, the second drain, and the third drain, the fourth transistor having an active area smaller than the active area of the first transistor; and
  a third source contact directly above the fourth transistor and directly coupled to the third bond wire, the third source contact coupled to the first source, the second source, the third source, and the fourth source via the metallization layer; and
wherein the protection circuit applies the first voltage to the fourth gate to turn on the fourth transistor in response to the input signal and applies the second voltage to the fourth gate to turn off the fourth transistor in response to the overload condition.

18. The system of claim 17, wherein the active area of the third transistor is directly adjacent to the active area of the second transistor and the active area of the fourth transistor; and
wherein the active area of the first transistor is directly adjacent to the active area of the second transistor, the active area of the third transistor, and the active area of the fourth transistor.

19. The system of claim 17, wherein the active area of the first transistor directly contacts the active area of the second transistor, the active area of the third transistor, and the active area of the fourth transistor.

20. A system comprising:
a power MOS transistor including a source contact and a drain contact;
a protection circuit for dynamically adapting an active area of the power MOS transistor based on a condition of a load coupled to the power MOS transistor; and
a first bond wire directly coupled to the source contact;
wherein the power MOS transistor comprises:
  a main metal-oxide-semiconductor (MOS) transistor having a first gate coupled to the protection circuit, a first source coupled to the source contact, and a first drain coupled to the drain contact; and
  a bond MOS transistor having a second gate coupled to the protection circuit, a second source coupled to the source contact, and a second drain coupled to the drain contact;
wherein the source contact is directly above the bond MOS transistor.

21. The system of claim 20, wherein the protection circuit is configured to apply a first voltage to the first gate and to the second gate to turn on the main MOS transistor and the bond MOS transistor in response to a non-overload condition and for applying a second voltage to the second gate to turn off the bond MOS transistor in response to an overload condition.

22. The system of claim 20, wherein the source contact is coupled to the first source and the second source through a metallization layer.

23. The system of claim 20, wherein an active area of the main MOS transistor is larger than an active area of the bond MOS transistor.

24. The system of claim 23, wherein the active area of the main MOS transistor laterally surrounds the active area of the bond MOS transistor.

* * * * *